United States Patent
Seeley et al.

(10) Patent No.: US 6,370,028 B1
(45) Date of Patent: Apr. 9, 2002

(54) PC CARD WITH ANTI-SMILE COVER

(75) Inventors: Gregory Alan Seeley, Orange; Franciscus Cornelis van Beers, Trabuco Canyon, both of CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 09/440,194

(22) Filed: Nov. 15, 1999

(51) Int. Cl.⁷ .............................. H05K 1/14; H05K 5/04
(52) U.S. Cl. ................... 361/737; 361/753; 361/801; 439/946; 211/41.17
(58) Field of Search ...................... 361/728, 736, 361/737, 752, 753, 796, 801; 211/41.17; 206/706; 220/4.02; 174/50; 439/946

(56) References Cited

U.S. PATENT DOCUMENTS

| | | | |
|---|---|---|---|
| 2,073,174 A | 3/1937 | Potter | 153/54 |
| 5,055,971 A | 10/1991 | Fudala et al. | 361/400 |
| 5,247,825 A | 9/1993 | Erickson | 72/339 |
| 5,273,459 A | * 12/1993 | Davis | 439/607 |
| 5,299,940 A | 4/1994 | Uenaka et al. | 439/76 |
| 5,463,531 A | 10/1995 | Choon et al. | 361/737 |
| 5,470,237 A | 11/1995 | Byczek et al. | 439/76.1 |
| 5,490,043 A | 2/1996 | Tan et al. | 361/818 |
| 5,502,892 A | 4/1996 | Lien | 29/841 |
| 5,627,729 A | 5/1997 | Oldendorf et al. | 361/737 |
| 5,846,092 A | 12/1998 | Feldman et al. | 439/76.1 |

* cited by examiner

Primary Examiner—Jayprakash N. Gandhi
(74) Attorney, Agent, or Firm—Roger C. Turner

(57) ABSTRACT

A sheet metal cover part (30) whose front end (70) lies against a surface (50) of a front connector, behind a projecting ridge (54), is prevented from deflecting upwardly and creating a "smile" by deforming a front end of the sheet metal to form a beam of greater height than the thickness of the sheet metal. In one construction, the front edge of the sheet metal is bent over by about over 45° so the sheet metal of 0.2 mm thickness is provided with a front edge where the distance (E) between the top and bottom is 0.3 mm. In another construction, a strip-shaped area (130) lying slightly rearward of the extreme edge (90C) of the sheet metal is deformed to form a stiffening beam.

13 Claims, 3 Drawing Sheets

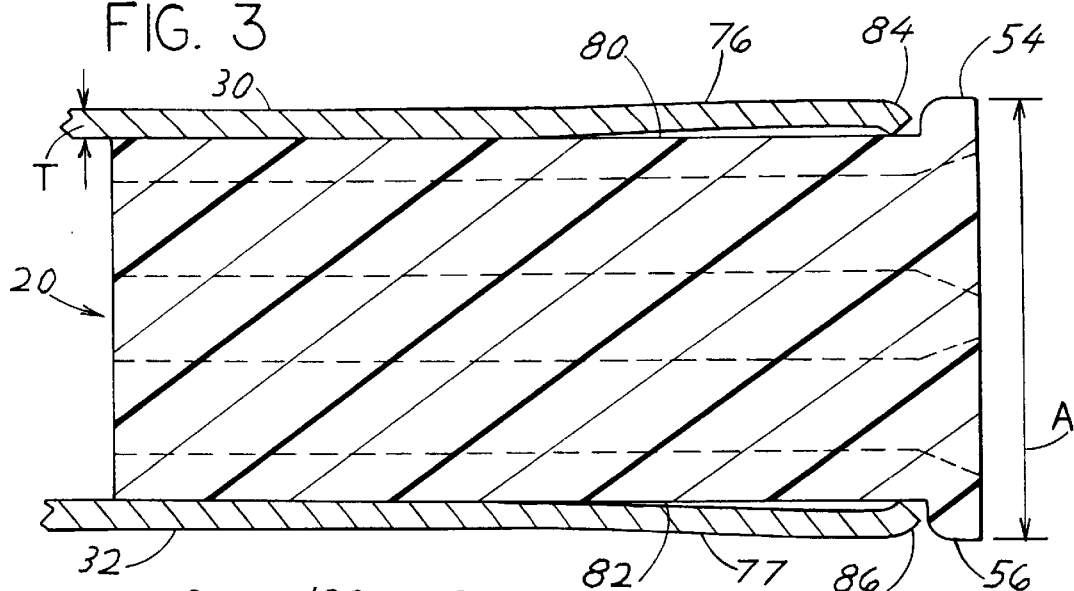
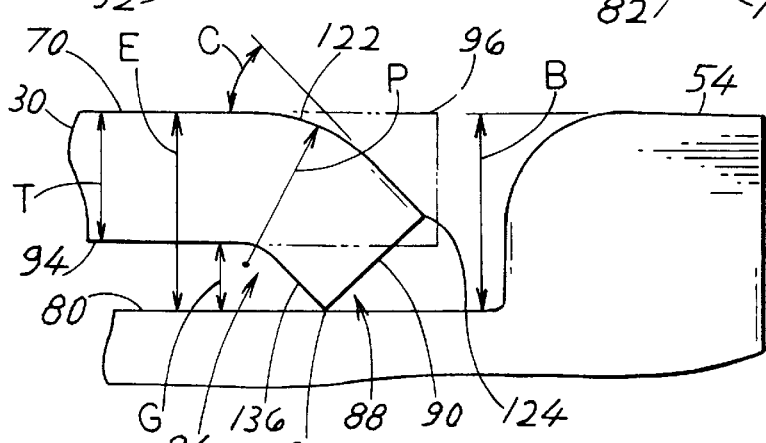
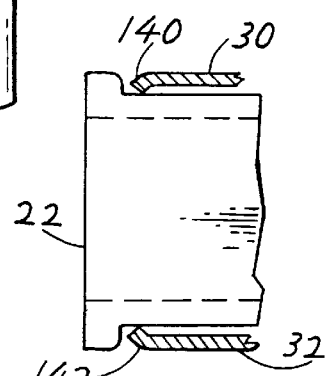
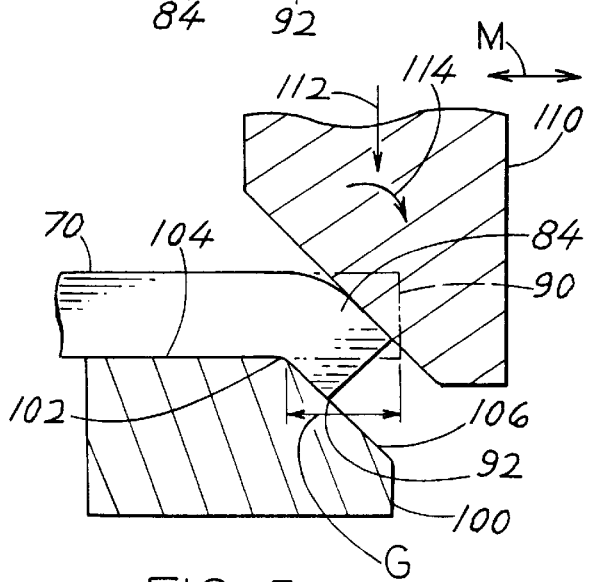
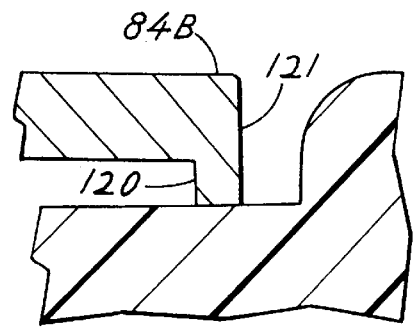

US 6,370,028 B1

PC CARD WITH ANTI-SMILE COVER

BACKGROUND OF THE INVENTION

Most typical IC cards are PC cards constructed in accordance with PCMCIA (Personal Memory Card International Association) standards that specify a card width of 54 mm and a maximum card thickness of 5 mm (for Type II Cards which are the most common), with a front region having 68 contact positions and a maximum thickness of 3 mm. Another popular IC card is a compact flash card having a width of about 43 mm and only 50 contact positions. Each PC card includes a circuit board, a front connector at the front end of the circuit board, and top and bottom cover halves. The cover halves include sheet metal cover parts that lie respectively above and below the circuit board. The connector has flat top and bottom surfaces with a projecting ridge at the front end. The front ends of the sheet metal parts lie substantially against the flat surfaces, behind the ridges.

The sheet metal cover parts are fixed to each other at the sides of the card, but are generally not held down between their opposite sides. This can lead to the front end of the sheet metal parts bending upwardly at their middles, above the connector ridges, resulting in a condition called "smiling". If the sheet metal cover part were to project by a plurality of millimeters beyond a front connector ridge, then this could cause interference with parts of the host that receives that PC card. However, customers have generally rejected a PC card if there is any noticeable "smiling". A similar "smiling" condition can appear at the rear of a PC card.

"Smiling" can be avoided by adding an adhesive tape to hold down an end of the sheet metal part to a front connector or rear end part. Also, glue can be used instead of tape. The attachment of adhesive tape by the manufacturer adds to the card cost, while the need for the customer to remove the tape backing and assure alignment before the adhesive tape on the sheet metal touches the connector, adds labor to the customer who must assemble the parts of the PC card. The applying of glue by the customer is messy and difficult. A way for avoiding "smiling" in a manner that is of minimal cost to the manufacturer and which avoids extra steps by the customer who must assemble the PC card parts, would be of value.

SUMMARY OF THE INVENTION

In accordance with one embodiment of the present invention, an IC card is provided, of the type which has top and bottom sheet metal cover parts with ends each lying behind an upstanding ridge of a front connector or rear end cap, where the end of the sheet metal cover part is constructed to minimize "smiling". The end of the sheet metal cover part is downwardly deformed into a beam of a thickness greater than the sheet metal, with the increased thickness of the beam allowing the beam to resist deflection that would cause "smiling".

The beam of increased thickness can be formed by bending over the front or rear edge part of the sheet metal. In another construction, a laterally-extending strip of the sheet metal end portion is downwardly deformed to form a strip-shaped area which is slightly spaced from an extreme edge of the cover part.

The novel features of the invention are set forth with particularity in the appended claims. The invention will be best understood from the following description when read in conjunction with the accompanying drawings.

BRIEF DESCRIPTION OF THE DRAWINGS

FIG. 3 is a sectional view taken on line 3—3 of FIG. 1.

FIG. 4. Is an enlarged view of a portion of FIG. 3.

FIG. 5 is a view of the cover part of FIG. 4, showing how it is deformed.

FIG. 5A is a sectional view taken on line 5A—5A of FIG. 1.

FIG. 6 shows another embodiment of the invention which is similar to FIG. 4, but with the sheet metal deformed in a different manner.

DESCRIPTION OF THE PREFERRED EMBODIMENTS

Figure 1:
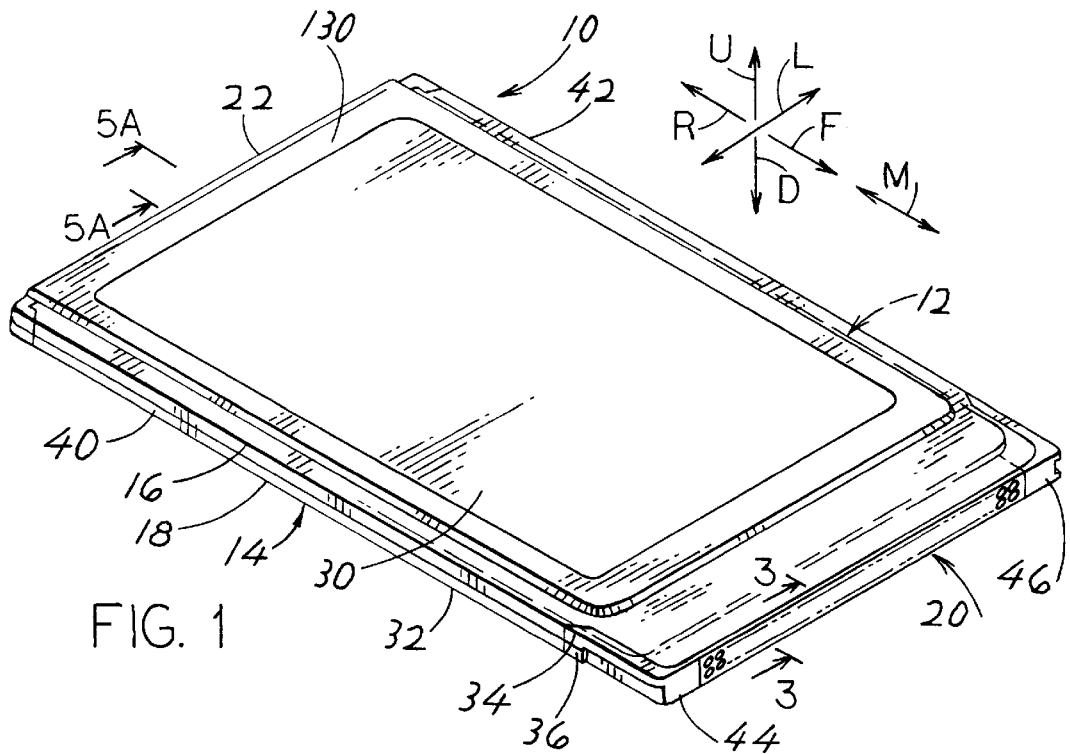
FIG. 1 is a top and front isometric view of an IC card of the present invention.

FIG. 1 illustrates an IC card 10 which includes a circuit board 12 that carries circuit components such as integrated circuits (IC's), a cover 14 that surrounds the circuit board and that includes top and bottom cover halves 16, 18, a front connector 20, and a rear end cap 22. Each of the cover halves includes a sheet metal cover part 30, 32 that lies above or below the circuit board, and a plastic part 34, 36 that is molded to the sheet metal cover parts at laterally L opposite sides 40, 42 of the card. When the parts of the card are assembled, ultrasonic energy is applied to the opposite sides 40, 42 of the cover to ultrasonically weld the plastic parts 34, 36 together. The plastic parts also form keys 44, 46 at opposite sides of the front end of the card, which assure that the card is not inserted upside down into a slot of an electronic device. Up and down directions are indicated by arrows U, D, while forward and rearward longitudinal directions are indicated by arrows F and R and the longitudinal directions are indicated by arrow M. It should be noted that cover halves often have overlapping side rails that are welded or bonded together, instead of providing molded-in plastic parts that are ultrasonically welded together.

Figure 2:
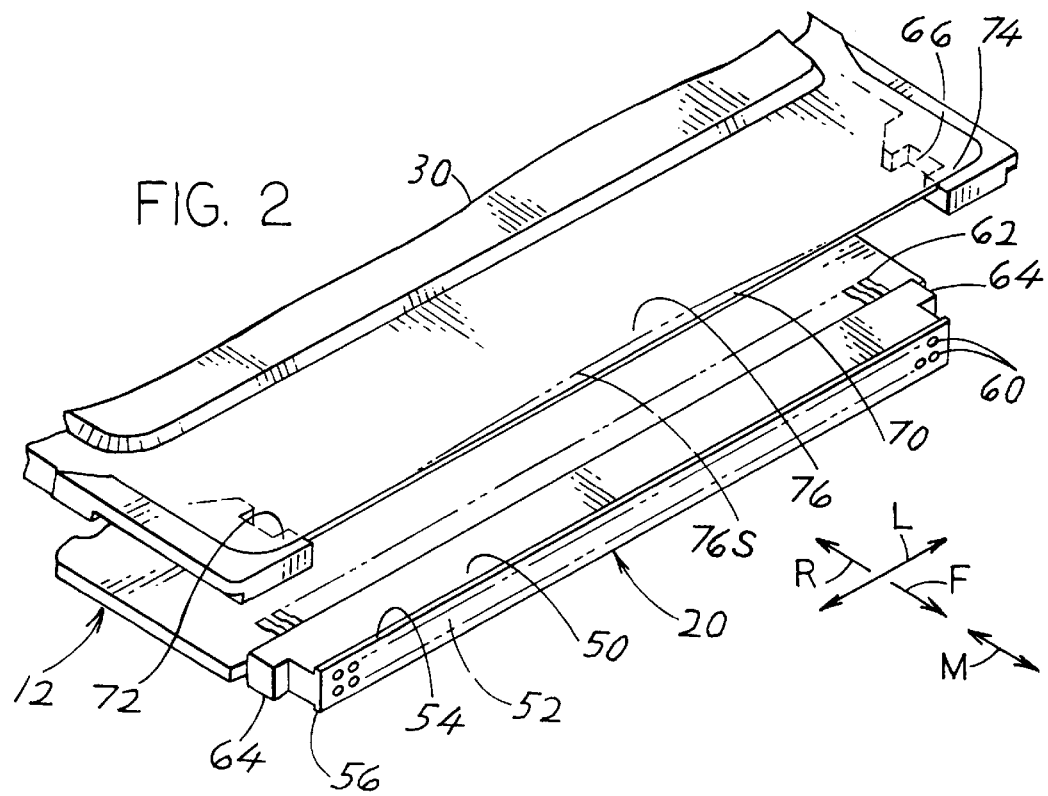
FIG. 2 is an exploded isometric view of a portion of the IC card of FIG. 1.

As shown in FIG. 2, the front connector 20 has flat top and bottom surfaces 50, 52, and has a projecting ridge 54, 56 that projects beyond each corresponding surface. Each ridge lies at the front end of a flat surface. The front connector has sixty-eight contact positions 60, with the contacts lying in those positions having tails 62 that are soldered to traces on the circuit board 12. Laterally opposite sides of the front connector have lugs 64 that are received in recesses 66 formed in the plastic parts of the cover halves and that are trapped in place when the plastic parts are ultrasonically welded together. The sheet metal cover parts such as the top one 30 has a front end 70 that lies substantially against a corresponding flat top surface 50 of the front connector.

The front end 70 of the sheet metal cover part 30, lies immediately behind the corresponding ridge 54. Only opposite sides 72, 74 of the sheet metal front end 70 are directly fixed in position with respect to the front connector 20. As a result, the middle 76 of the front end 70 of the sheet metal is not directly fixed in position. The sheet metal is thin, and is generally of stainless steel having a thickness of 0.008 inch (0.2 mm). As a result, the middle front end 76 can sometimes bend upward, as to the smiling position shown in phantom lines at 76S, wherein the middle of the sheet metal front end lies above the upper ridge 54. A similar downward smiling of the lower sheet metal cover part can result in smiling of a lower end. If a customer notices the smiling, which may occur when the middle front end 76 lies perhaps ½ millimeter above the ridge 54, the customer may reject the IC card. A rejection on the grounds of smiling can result in considerable cost to the manufacturer.

In accordance with the present invention, applicant constructs the middle 76 of the sheet metal cover front end portion, so it is of increased thickness for increased rigidity. FIG. 3 shows the front end portions 76, 77 of the top and bottom sheet metal parts 30, 32, showing that the front end portions, lie substantially against the flat surfaces 80, 82 of the front connector 20. It can be seen that the front edge 84, 86 of the sheet metal cover parts are bent to increase their rigidity. Such increased rigidity can prevent the front edges from bending upward and lying sufficiently above the corresponding connector ridge 54, 56 that a customer would reject the connector.

FIG. 4 is an enlarged view showing the bent front edge portion 84 of the top sheet metal cover part 30 which forms a beam portion or beam 88 of greater height than that of the flat sheet metal. The entire height A (FIG. 3) of the front end of the front connector is specified to be 3.3 mm plus or minus 0.1 mm, while the height B (FIG. 4) of the ridge is 0.3 mm. The height B can vary slightly but usually is within 0.05 mm of the height of 0.3 mm. Applicant prefers to bend the front edge portion 84 of the sheet metal cover part so the extreme edge 90 has a lower end 92 that lies below the lower end 94 of the undeformed portion of the sheet metal which lies rearward of it. The undeformed sheet metal front edge portion is shown in phantom lines at 96. The extreme edge 90 lies closely behind the ridge, that is, within a distance of twice the sheet metal thickness T (0.2 mm) and preferably no more than the thickness T. Applicant prefers to bend the front edge portion 84 by an angle C of about 45 degrees, that is, an angle of between 15 degrees and 70 degrees. An angle of less than 15 degrees results in a long bent region which is unsightly. A bend angle of more then 70 degrees is not easily accomplished with simple tooling that can be used for a bend angle of 45 degrees. The bending results in an extra height G of 0.1 mm and an equivalent beam thickness E of 0.3 mm, which equals the height B of the ridge.

The strength of a beam is proportional to the square of the height of the beam, while the rigidity of a beam is proportional to the cube of the height of the beam. By applicant increasing the height of the beam by 50%, from the sheet metal thickness T of 0.2 mm to the beam thickness E of 0.3 mm, applicant increases the ridgedity of the front edge portion 84 of the sheet metal by about 3 times. As a result, the front end of the sheet metal cover part is more ridged against upward bending of its middle that could result in a "smiling" condition.

FIG. 5 shows a simple way in which the front end portion 70 of the sheet metal cover part can be bent. The front end is laid on a lower die 100, with the front edge portion positioned over a location 102 of small radius which is an intersection between a horizontal surface 104 and a 45 degree incline surface 106 of the die. Then, an upper die 110 is either moved down against the front end portion 84 as indicated by arrow 112, or is pressed down and rolled, as indicated by arrow 114, to the position shown in FIG. 5. In either case, the front end portion 84 of the sheet metal is bent. The longitudinal M distance between the extreme front edge 90 of the sheet metal before it is bent and the location on the sheet metal which is placed on the intersection at 102 is chosen so that after bending the lower corner at 92 will lie 0.1 mm below the bottom of the unbent sheet metal.

It is possible to bend the front edge portion shown in FIG. 6 at 84B so it provides a thicker depending sheet part at 120, with a right angle bend. However, this requires additional tooling to deform the extreme front edge at 121. Furthermore, applicant finds an advantage of the bent front end portion 84 in FIG. 4 over the 90 degree bend in FIG. 6. In FIG. 4, the 45 degree bend at 122 provides a gradually curved surface at the top of the front of the sheet metal. As a result, if the front end portion 84 should rise slightly above the corresponding flat surface 80 of the front connector, such slight "smiling" will not be noticeable. Only if the upper end 124 of the extreme edge 90 rises above the top of the ridge 84, may the smiling be noticeable.

Figure 7:
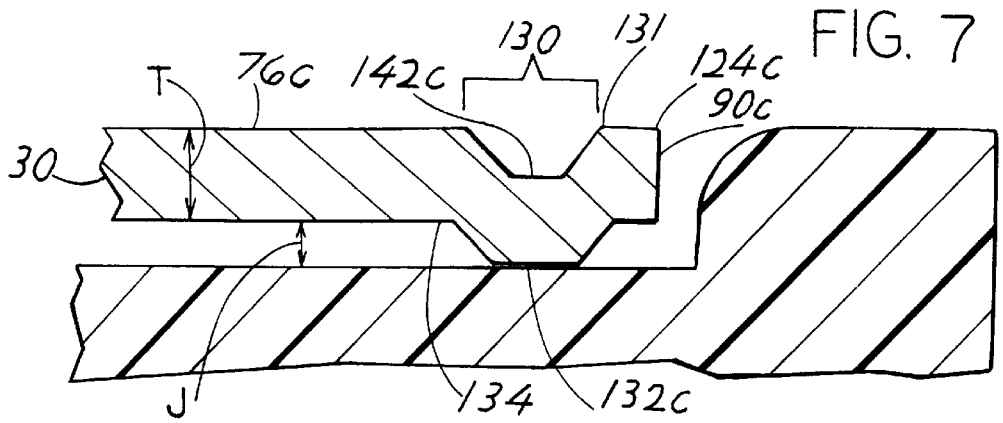
FIG. 7 is a partial sectional view of an IC card of another embodiment of the invention, where the sheet metal end is deformed in a different manner.
Figure 9:
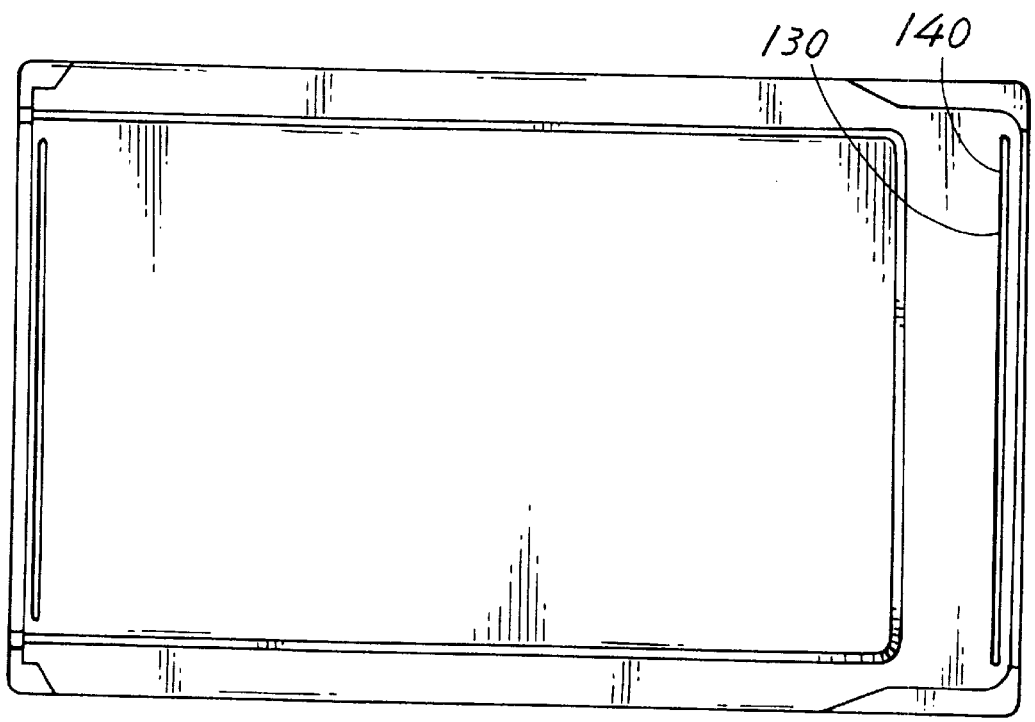
FIG. 9 is a plan view of a complete IC card with the sheet metal cover part end deformed in the manner shown in FIGS. 7 and 8.

FIG. 7 illustrates another sheet metal front end portion 76C with a strip shaped area 130 that is downwardly deformed. The front end 131 of the area is spaced rearwardly of the extreme front edge, by a small distance which is preferably less than 10 times the sheet metal thickness T. The downwardly deformed area has a bottom 132C which lies a distance J of 0.1 mm below an adjacent portion 134 of the sheet metal cover part 30 which has a thickness T of 0.2 mm. The result is a beam portion of increased height which can better resist upward deflection. The beam in the strip area 130 has an advantage over the beam of FIG. 4 in that the beam area 130 has a greater width at the bottom, and therefore is more resistant to bending then the thin lower beam portion 136 in FIG. 4. However, the construction of FIG. 7 has disadvantages. One disadvantage is that the extreme front edge 90C has an upper end 124C which will be as noticeable as a prior art sheet metal cover part front edge, so if the front edge 90C deflects upwardly, it may be noticeable. This compares to the smoothly bent bend 122 in FIG. 4, which is not noticeable when it deflects slightly above the top of the ridge 54. It is possible to deform the front edge 90C into a round edge, but this adds cost. Another possible disadvantage of the deformed beam area 130 in FIG. 7 is that the deformed area 130 is highly noticeable. If the retail customer does not object to the presence of the strip-shaped area 130, whose appearance is shown in FIG. 9, then the area 130 will be accepted.

Figure 8:
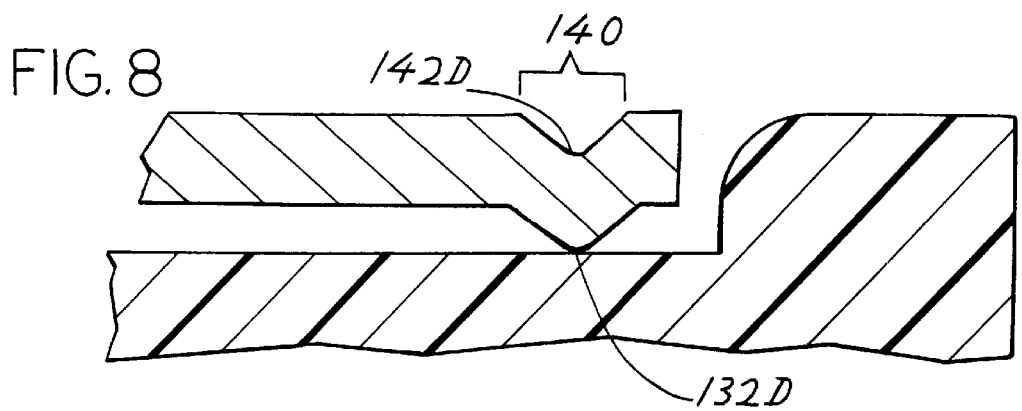
FIG. 8 is a sectional view of a portion of another embodiment of the invention, where the sheet metal cover part end is deformed in a different manner.

FIG. 8 shows another strip-shaped area 140 which is downwardly deformed to form a beam of increased height for greater ridgedity. The bottoms 142D and 132D of the deformed area are very small, compared to the flat bottoms 142C and 132C of FIG. 7. The construction of FIG. 8 is slightly stiffer then that of FIG. 7.

The particular IC card of FIG. 1 has a rear end cap 22 that lies in a space between the top and bottom cover halves 16, 18. It is noted that in some IC cards, where there is not a connector at the rear, the plastic parts 34, 36 extend along the rear and are ultrasonically welded together thereat. However, in the case of a rear end cap 22, the rear end portion 130 of the upper sheet metal cover part 30 is not fixed to the rear end cap 22, and there is a possibility of "smiling" at the rear end. The dimensions of the rear end of the IC card are usually not critical, so smiling is usually not a real practical problem. However, customers may view it as a problem in allowing dirt to enter the card, and may reject the IC card if there is appreciable smiling at the rear end. FIG. 5A shows the rear end cap 22 and the top and bottom sheet metal cover parts 30, 32, with rear end edge portions 140, 142 that have been bent to form beam areas of increased thickness, in the same manner as shown in FIG. 4 for the front end portion. Since the rear end cap 22 usually holds contacts, it may be referred to as a connector.

While terms such as "top", "bottom", "front", "rear", "horizontal", etc. have been used to help describe the invention as illustrated, it should be understood that the IC card can be used in any orientation with respect to the Earth.

Thus, the invention provides an IC card having sheet metal cover parts with end portions that are rigidized against upward bending into a noticeable "smiling" position. This is accomplished by bending an edge portion of the sheet metal cover part to provide a beam portion of increased thickness. The beam portion extends across most of the width of the sheet metal cover part, to resist upward bending of the middle with greater resistance then the end of an unbent piece of sheet metal of the same thickness. The bending is preferably done by bending the end by about 45 degrees so the perpendicular extreme edge of the sheet metal faces downwardly, preferably by an angle of between 15 degrees and 70 degrees to the horizontal. This results in the edge portion having an upper surface which is convexly rounded, so that even slight upward deflection of the edge portion will not be noticeable behind the projecting ridge of the front connector or rear end cap. It is even possible to provide a thickened bar-shaped area of sheet metal at an edge, although this increases cost.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An IC card which includes a circuit board having front and rear ends and laterally-spaced opposite sides, said card also including top and bottom sheet metal cover halves lying respectively above and below said circuit board, and a front connector coupled to said circuit board front end and sandwiched between said top and bottom cover halves, wherein said front connector has top and bottom connector surfaces and a laterally-extending ridge at a front end of each of said surfaces with each ridge projecting beyond the corresponding surface, and each of said cover halves has a sheet metal cover part with a front end which lies on one of said connector surfaces and closely behind a corresponding one of said ridges, said cover part front end having laterally opposite sides and a middle lying between said opposite sides, wherein:

said top cover half is formed of sheet metal of a predetermined thickness and said middle of said top cover front end is free to deflect upwardly, said middle of said top cover front end having a downwardly-deformed part forming a laterally-extending beam of a thickness greater than said predetermined thickness, to increase the rigidity of said middle of said top cover front end.

2. The IC card described in claim 1 wherein:

said top cover front end has a front edge that is bent at an angle of between 20° and 70° from the horizontal to form a bend, with the upper surface of said bend having a radius of curvature of at least said predetermined thickness, whereby to provide the beam by simple bending of said front edge.

3. The IC card described in claim 1 wherein:

said downwardly deformed part lies in a strip shaped area which is spaced rearwardly from an extreme front edge of said top cover front end.

4. The IC card described in claim 1 wherein:

said ridges of said front connector each projects 0.3 mm beyond the corresponding surface, said sheet metal of said top cover has thickness of 0.2 mm and has top bottom sheet metal surfaces at said cover front end, and said downwardly-deformed part extends 0.1 mm below said bottom sheet metal surface.

5. The IC card described in claim 1 wherein:

said top sheet metal cover half is formed of sheet metal having a predetermined sheet metal thickness;

said top cover half front portion has an extreme front edge, and said downwardly-deformed part has a bottom lying within a region extending rearward of said extreme front edge by ten times said sheet metal thickness.

6. An IC card which includes a laterally-extending front connector having a flat top surface and an upstanding ridge at a front end of said top surface, and a sheet metal top cover half with a front end that lies on said top surface wherein:

said front end of said top cover half has a front edge with a middle portion that is free to deflect upwardly, said middle portion having a part that is bent downward to form a rigidizing beam.

7. The IC card described in claim 6 wherein:

said upstanding ridge extends by 0.3 mm above said flat top surface, said sheet metal of said top cover half has a thickness of 0.2 mm, and said front edge is bent to extend 0.1 mm below a location of said top cover half that lies immediately rearward of said bent front edge.

8. An IC card which includes a circuit board having front and rear ends and laterally-spaced opposite sides, said card also including top and bottom sheet metal cover halves lying respectively above and below said circuit board, and a front connector coupled to said circuit board front end and sandwiched between said top and bottom cover halves, wherein said front connector has top and bottom connector surfaces and a laterally-extending ridge at a front end of each of said surfaces with each ridge projecting beyond the corresponding surface, and each of said cover halves has a sheet metal cover part with a front end which lies on one of said connector surfaces and closely behind a corresponding one of said ridges, wherein:

said top cover half is formed of sheet metal of a predetermined thickness and said top cover front end has a downwardly-deformed part forming a laterally-extending beam of a thickness greater than said predetermined thickness, to increase the rigidity of said top cover front end;

said top sheet metal cover half is formed of sheet metal having a predetermined sheet metal thickness;

said top cover half front portion has an extreme front edge, and said downwardly-deformed part has a bottom lying within a region extending rearward of said extreme front edge by ten times said sheet metal thickness.

9. The IC card described in claim 8 wherein:

said downwardly deformed part lies in a strip shaped area which is spaced rearwardly from an extreme front edge of said top cover front end.

10. The IC card described in claim 8 wherein:

said ridges of said front connector each projects 0.3 mm beyond the corresponding surface, said sheet metal of said top cover has thickness of 0.2 mm and has top bottom sheet metal surfaces at said cover front end, and said downwardly-deformed part extends 0.1 mm below said bottom sheet metal surface.

11. An IC card which includes a circuit board having front and rear ends and laterally-spaced opposite sides, said card also including top and bottom sheet metal cover halves lying respectively above and below said circuit board, and a front connector coupled to said circuit board front end and sandwiched between said top and bottom cover halves, wherein said front connector has a substantially flat top connector surface, said top cover half has a sheet metal cover part with a front end that has opposite sides and a middle, said middle lying on said connector flat top surface, and said middle being capable of deflecting upwardly off said connector flat top surface, wherein:

said top cover half is formed of sheet metal of a predetermined thickness and said middle of said top cover front end has a downwardly-deformed part forming a rigidizing beam of a thickness greater than said predetermined thickness, to increase the rigidity of said middle of said top cover front end.

12. The IC card described in claim 11 wherein:

said top cover front end has a front edge that is bent at an angle of between 20° and 70° from the horizontal to form a bend, with the upper surface of said bend having a radius of curvature of at least said predetermined thickness, whereby to provide the beam by simple bending of said front edge.

13. The IC card described in claim 11 wherein:

said front connector has an upstanding ridge lying forward of said top connector surface, and said middle of said top cover front end lies behind and free of rigid connection to said ridge.

* * * * *